(12) United States Patent
Ichikawa

(10) Patent No.: US 10,720,329 B2
(45) Date of Patent: Jul. 21, 2020

(54) METHOD OF MANUFACTURING SEMICONDUCTOR APPARATUS AND SEMICONDUCTOR APPARATUS

(71) Applicant: DENSO CORPORATION, Kariya-shi (JP)

(72) Inventor: Shuhei Ichikawa, Nisshin (JP)

(73) Assignee: DENSO CORPORATION, Kariya-shi (JP)

( * ) Notice: Subject to any disclaimer, the term of this patent is extended or adjusted under 35 U.S.C. 154(b) by 0 days.

(21) Appl. No.: 16/131,957

(22) Filed: Sep. 14, 2018

(65) Prior Publication Data
US 2019/0109005 A1    Apr. 11, 2019

(30) Foreign Application Priority Data

Oct. 6, 2017   (JP) .................................. 2017-196330

(51) Int. Cl.
| H01L 21/04 | (2006.01) |
| H01L 29/16 | (2006.01) |
| H01L 29/47 | (2006.01) |
| H01L 29/66 | (2006.01) |
| H01L 29/872 | (2006.01) |
| H01L 29/06 | (2006.01) |

(52) U.S. Cl.
CPC .......... *H01L 21/0495* (2013.01); *H01L 29/47* (2013.01); *H01L 29/6606* (2013.01); *H01L 29/872* (2013.01); *H01L 29/063* (2013.01); *H01L 29/0619* (2013.01); *H01L 29/0623* (2013.01); *H01L 29/1608* (2013.01)

(58) Field of Classification Search
CPC .......... H01L 21/0495; H01L 21/02167; H01L 21/02378; H01L 21/0445; H01L 29/872; H01L 29/47; H01L 29/66143; H01L 29/1608; H01L 29/6606; H01L 29/0619; H01L 29/0623; H01L 29/66848; H01L 29/812

See application file for complete search history.

(56) References Cited

U.S. PATENT DOCUMENTS

| 2008/0121934 A1* | 5/2008 | Matsuda ............. H01L 29/2003 257/192 |
| 2010/0244049 A1* | 9/2010 | Yamamoto .......... H01L 21/0465 257/77 |
| 2015/0129896 A1* | 5/2015 | Kawakami ............ H01L 29/47 257/77 |

FOREIGN PATENT DOCUMENTS

JP   2010-225877 A   10/2010

* cited by examiner

*Primary Examiner* — David C Spalla
(74) *Attorney, Agent, or Firm* — Hunton Andrews Kurth LLP

(57) ABSTRACT

A method of manufacturing a semiconductor apparatus includes preparing a semiconductor substrate, and forming a Schottky electrode that is in Schottky contact with a surface of the semiconductor substrate. The Schottky electrode is made of a metal material containing a predetermined concentration of oxygen atoms.

6 Claims, 9 Drawing Sheets

METHOD OF MANUFACTURING SEMICONDUCTOR APPARATUS AND SEMICONDUCTOR APPARATUS

INCORPORATION BY REFERENCE

The disclosure of Japanese Patent Application No. 2017-196330 filed on Oct. 6, 2017 including the specification, drawings and abstract is incorporated herein by reference in its entirety.

BACKGROUND

1. Technical Field

The present disclosure relates to a method of manufacturing a semiconductor apparatus and a semiconductor apparatus.

2. Description of Related Art

Japanese Unexamined Patent Application Publication No. 2010-225877 discloses a semiconductor apparatus including a semiconductor substrate, and a Schottky electrode that is in Schottky contact with a surface of the semiconductor substrate. The Schottky electrode has a metal layer and a metal oxide layer, and is in contact with the surface of the semiconductor substrate through the metal oxide layer. As a result, it is possible to make a Schottky barrier height between the semiconductor substrate and the Schottky electrode high. Accordingly, a reverse leak current value is reduced.

SUMMARY

In the semiconductor apparatus, the Schottky electrode needs to have at least two layers of the metal layer and the metal oxide layer. Accordingly, a manufacturing process of the Schottky electrode may become complicated.

The present disclosure provides a technique for more easily forming a Schottky electrode having a higher Schottky barrier height with respect to a semiconductor substrate.

A first aspect of the present disclosure relates to a method of manufacturing a semiconductor apparatus. The method includes preparing a semiconductor substrate, and forming a Schottky electrode that is in Schottky contact with a surface of the semiconductor substrate. The Schottky electrode is made of a metal material containing a predetermined concentration of oxygen atoms.

In the method according to the first aspect of the present disclosure, the semiconductor substrate may be a silicon carbide substrate. The metal material may be molybdenum. The predetermined concentration may be a value within a range of $1.0E19$ $cm^{-3}$ to $1.0E22$ $cm^{-3}$.

In the method according to the first aspect of the present disclosure, the Schottky electrode may have a single layer structure of the metal material.

In the method according to the first aspect of the present disclosure, the forming of the Schottky electrode may be performed by a reactive sputtering method that adds gas containing oxygen atoms to atmospheric gas.

In the method according to the first aspect of the present disclosure, the forming of the Schottky electrode may be performed by a sputtering method using a target containing an oxide of the metal material.

In the method according to the first aspect of the present disclosure, in forming the Schottky electrode, a laminated structure having a layer of the metal material and a layer of an oxide of the metal material alternately laminated may be formed on the surface of the semiconductor substrate, and the semiconductor substrate on which the laminated structure is formed may be subjected to annealing processing to diffuse oxygen atoms from the layer of the oxide of the metal material to the layer of the metal material.

In the method according to the first aspect of the present disclosure, in forming the Schottky electrode, the surface of the semiconductor substrate may be oxidized, a film of the metal material may be formed on the oxidized surface of the semiconductor substrate, and the semiconductor substrate on which the film is formed may be subjected to annealing processing to diffuse oxygen atoms from the semiconductor substrate to the film.

A second aspect of the present disclosure relates to a semiconductor apparatus. The semiconductor apparatus includes a semiconductor substrate, and a Schottky electrode that is in Schottky contact with an upper surface of the semiconductor substrate. The Schottky electrode is made of a metal material containing a predetermined concentration of oxygen atoms.

With the above-described configuration, the Schottky electrode is made of the metal material containing the predetermined concentration of oxygen atoms. As a result, it is possible to make a Schottky barrier height between the Schottky electrode and the semiconductor substrate higher compared to a case where the metal material does not contain oxygen atoms. The metal material forming the Schottky electrode contains oxygen atoms. However, since the metal material has a comparatively low concentration of oxygen atoms and is different from the metal oxide, the conductivity of the Schottky electrode is sufficiently maintained. In a case where the metal material described above is used, it is possible to form the Schottky electrode even with a single layer structure. Accordingly, it is possible to restrain a manufacturing process of the Schottky electrode from becoming complicated. Therefore, it is possible to more easily form the Schottky electrode having a higher Schottky barrier height with respect to the semiconductor substrate.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
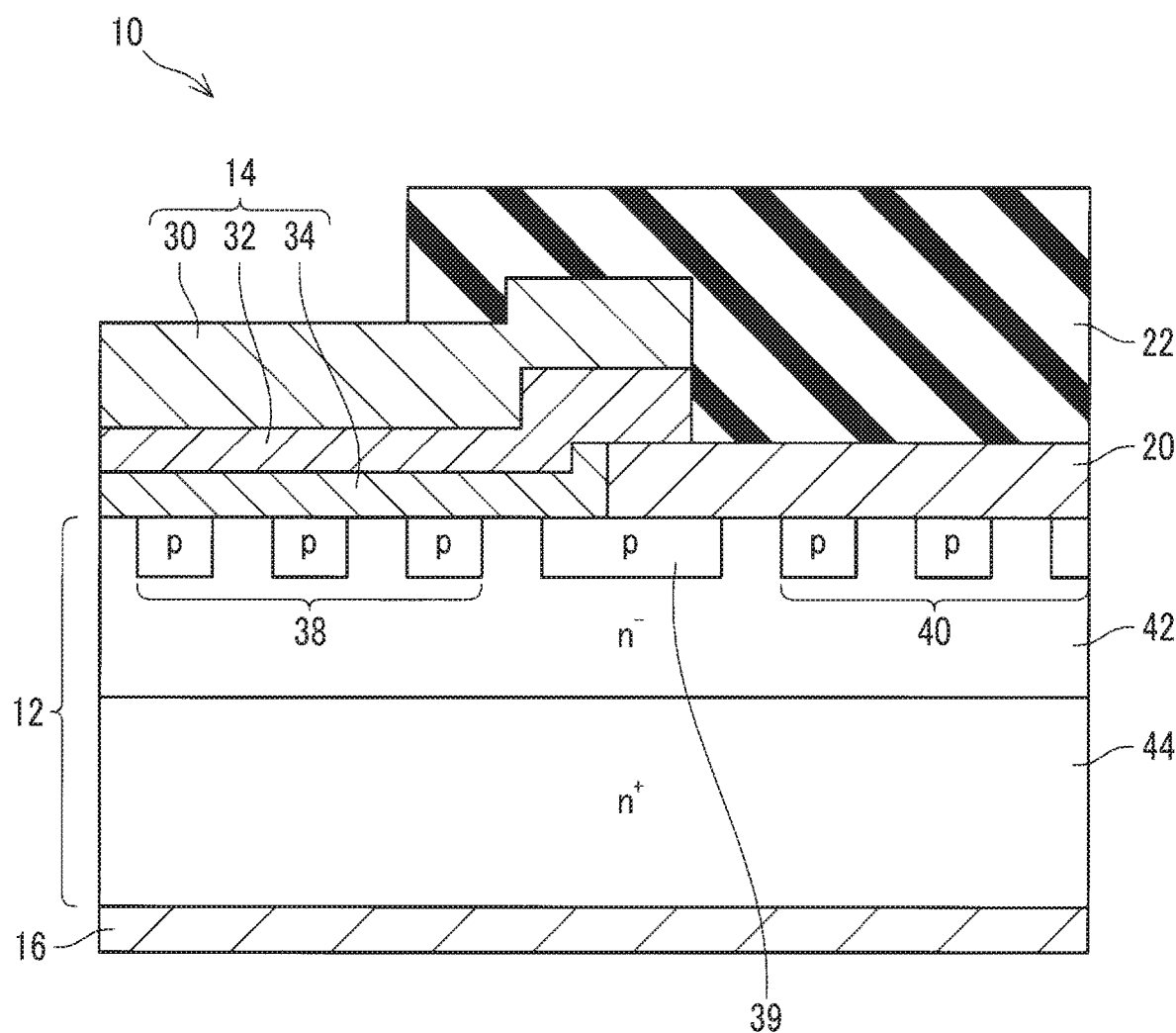
FIG. 1 is a sectional view showing a semiconductor apparatus according to an embodiment of the present disclosure.

In an embodiment of the present disclosure, a semiconductor substrate may be a silicon carbide substrate, and a metal material may be molybdenum. In this case, the predetermined concentration related to oxygen atoms may be a value within a range of $1.0E19$ $cm^{-3}$ to $1.0E22$ $cm^{-3}$. With the configuration described above, it is possible to adjust a Schottky barrier height to a value within a range of 0.9 eV to 1.25 eV. However, in another embodiment, the semiconductor substrate and the metal material may be formed of other substances. In this case, the predetermined concentration may not be a value within the above-described range.

In the embodiment of the present disclosure, a Schottky electrode may have a single layer structure of the metal material containing oxygen atoms. With the configuration described above, it is possible to more easily form the Schottky electrode.

In the embodiment of the present disclosure, the forming of the Schottky electrode may be performed by a reactive sputtering method that adds gas containing oxygen atoms to atmospheric gas. With the configuration described above, the concentration of gas having oxygen atoms added to atmospheric gas is changed, whereby it is possible to adjust the concentration of oxygen atoms contained in the metal material. Here, as gas containing oxygen atoms, for example, oxygen gas ($O_2$), carbon dioxide gas ($CO_2$), water vapor ($H_2O$), or the like is exemplified.

In the embodiment of the present disclosure, the forming of the Schottky electrode may be performed by a sputtering method using a target containing an oxide of the metal material. With the configuration described above, the ratio of metal atoms to oxygen atoms in an oxide to be a target is changed, whereby it is possible to adjust the concentration of oxygen atoms contained in the metal material.

In the embodiment of the present disclosure, in forming the Schottky electrode, a laminated structure having a layer of the metal material and a layer of an oxide of the metal material alternately laminated may be formed on the surface of the semiconductor substrate, and the semiconductor substrate on which the laminated structure is formed may be subjected to annealing processing to diffuse oxygen atoms from the layer of the oxide of the metal material to the layer of the metal material. With the configuration described above, the number or thickness of layers of the oxide of the metal material to be formed is changed, whereby it is possible to adjust the concentration of oxygen atoms contained in the metal material. At least one layer of the oxide of the metal material may be formed. The number of layers of the oxide of the metal material is not particularly limited.

In the embodiment of the present disclosure, in forming the Schottky electrode, the surface of the semiconductor substrate may be oxidized, a film of the metal material may be formed on the oxidized surface of the semiconductor substrate, and the semiconductor substrate on which the film is formed may be subjected to annealing processing to diffuse oxygen atoms from the semiconductor substrate to the film. With the configuration described above, the degree of oxidizing the surface of the semiconductor substrate is changed, whereby it is possible to perform adjustment to the predetermined concentration of oxygen atoms contained in the metal material.

In the embodiment of the present disclosure, a semiconductor apparatus includes a semiconductor substrate, and a Schottky electrode that is in Schottky contact with an upper surface of the semiconductor substrate. The Schottky electrode can be made of a metal material containing a predetermined concentration of oxygen atoms. With the configuration described above, it is possible to make a Schottky barrier height between the Schottky electrode and the semiconductor substrate higher compared to a case where the metal material does not contain oxygen atoms. The metal material forming the Schottky electrode contains oxygen atoms. However, since the metal material has a comparatively low concentration of oxygen atoms and is different from the metal oxide, the conductivity of the Schottky electrode is sufficiently maintained. In a case where the metal material described above is used, it is possible to form the Schottky electrode even with a single layer structure. Accordingly, it is possible to restrain a manufacturing process of the Schottky electrode from becoming complicated. Therefore, it is possible to more easily form the Schottky electrode having a higher Schottky barrier height with respect to the semiconductor substrate.

First, a semiconductor apparatus 10 according to an embodiment of the present disclosure will be described referring to FIG. 1. FIG. 1 is a sectional view showing the semiconductor apparatus 10. The semiconductor apparatus 10 includes a semiconductor substrate 12, an upper surface electrode 14, a lower surface electrode 16, an insulating film 20, and a protective film 22. The upper surface electrode 14 is in contact with an upper surface of the semiconductor substrate 12. The lower surface electrode 16 is in contact with a lower surface of the semiconductor substrate 12. The insulating film 20 and the protective film 22 are formed in a peripheral edge portion of the semiconductor apparatus 10 on the upper surface of the semiconductor substrate 12.

The semiconductor substrate 12 is an n-type semiconductor substrate. In the embodiment of the present disclosure, though not particularly limited, the semiconductor substrate 12 is a substrate of silicon carbide. The semiconductor substrate 12 includes an n-type lower layer 44, and an n-type drift layer 42 having a carrier concentration lower than that of the lower layer 44. The lower layer 44 is positioned in a lower layer of the semiconductor substrate 12, and is exposed to the lower surface of the semiconductor substrate 12. The drift layer 42 is formed on the lower layer 44, and is exposed to the upper surface of the semiconductor substrate 12.

The semiconductor substrate 12 has p-type contact layers 38, a p-type reduced surface field (RESURF) layer 39, and p-type guard ring layers 40. The layers 38, 39, 40 are exposed to the upper surface of the semiconductor substrate 12, and are surrounded by the drift layer 42 inside the semiconductor substrate 12. The layers 38, 39, 40 are insulated from the lower layer 44 by the drift layer 42.

The upper surface electrode 14 includes a surface electrode 30, an intermediate electrode 32, and a Schottky electrode 34. The surface electrode 30 and the intermediate electrode 32 are formed on the Schottky electrode 34. In the embodiment of the present disclosure, for example, the surface electrode 30 is made of aluminum. The intermediate electrode 32 is made of titanium. However, the present disclosure is not limited to those described above, and materials having sufficient conductivity may be used. The Schottky electrode 34 is in contact with the upper surface of the semiconductor substrate 12, and is in Schottky contact with the drift layer 42 exposed to the upper surface. In the embodiment of the present disclosure, the Schottky electrode 34 is made of molybdenum (hereinafter, referred to as "oxygen-containing molybdenum") containing oxygen atoms. This will be described below in detail. The surface electrode 30 and the intermediate electrode 32 form the integrated upper surface electrode 14 along with the Schottky electrode 34. However, the surface electrode 30 and the intermediate electrode 32 do not affect Schottky contact between the Schottky electrode 34 and the semiconductor substrate 12. From the above description, the surface electrode 30 and the intermediate electrode 32 are a configuration not included in the "Schottky electrode" in the specification.

The lower surface electrode 16 is in ohmic contact with the lower surface of the semiconductor substrate 12. The material of the lower surface electrode 16 is not particularly limited insofar as the lower surface electrode 16 can be in ohmic contact with the lower surface of the semiconductor substrate 12.

The insulating film 20 is positioned on the upper surface of the semiconductor substrate 12, and in particular, on the p-type RESURF layer 39 and the p-type guard ring layer 40. The insulating film 20 is in contact with the Schottky electrode 34 on the p-type RESURF layer 39. In the embodiment of the present disclosure, although the insulating film 20 is made of a silicon oxide ($SiO_2$), the material of the insulating film 20 is not limited to the silicon oxide, and a material having sufficient insulation may be used.

The protective film 22 extends along the peripheral edge of the semiconductor substrate 12, and covers the peripheral edge of the upper surface electrode 14 and the insulating film 20. In the embodiment of the present disclosure, although the protective film 22 is made of polyimide, the material of the protective film 22 is not limited to polyimide, and a material having sufficient insulation may be used.

With the above-described structure, the semiconductor apparatus 10 according to the embodiment of the present disclosure is embedded with a Schottky barrier diode that has the upper surface electrode 14 as an anode and the lower surface electrode 16 as a cathode. As described above, the Schottky electrode 34 is made of oxygen-containing molybdenum (that is, molybdenum containing oxygen atoms). Oxygen-containing molybdenum contains oxygen atoms. However, since the metal material has a comparatively low concentration of oxygen atoms and is different from molybdenum oxide (in particular, molybdenum trioxide), the conductivity of the Schottky electrode is sufficiently maintained. The concentration of oxygen atoms in oxygen-containing molybdenum is changed, whereby it is possible to adjust the Schottky barrier height between the Schottky electrode 34 and the semiconductor substrate 12. The Schottky electrode 34 is also in contact with the p-type contact layers 38 and the p-type RESURF layer 39. The Schottky electrode 34 is in ohmic contact with the layers 38, 39.

Figure 2A:
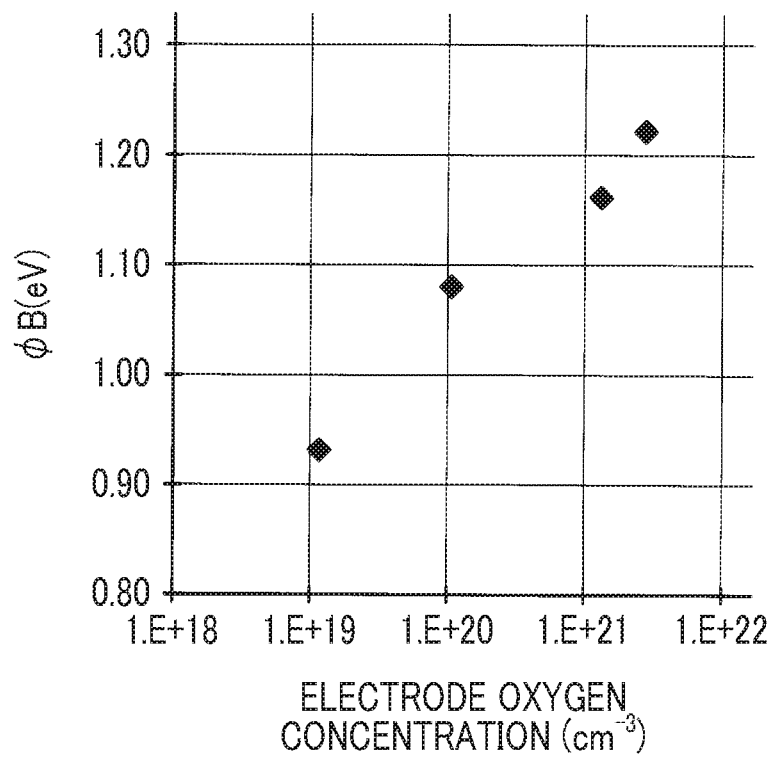
FIG. 2A is a graph showing the relationship between an oxygen content of a Schottky electrode and a Schottky barrier height.
Figure 2B:
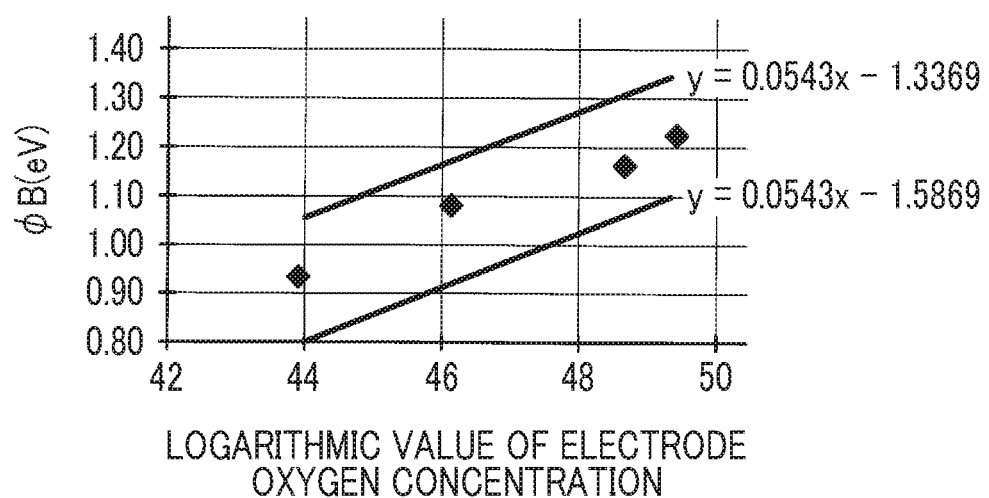
FIG. 2B is a graph showing the relationship between the oxygen content of the Schottky electrode and the Schottky barrier height.

FIGS. 2A and 2B are graphs showing the relationships between the concentration of oxygen atoms in oxygen-containing molybdenum and the Schottky barrier height between the Schottky electrode 34 and the semiconductor substrate 12. As shown in FIG. 2A, it is understood that the Schottky barrier height ($\phi B$) increases when the concentration of oxygen atoms in oxygen-containing molybdenum increases. The inventors have found through experiments that the concentration of oxygen atoms in oxygen-containing molybdenum is adjusted to a value within a range of 1.0E19 $cm^{-3}$ to 1.0E22 $cm^{-3}$, thereby adjusting the Schottky barrier height ($\phi B$) to a value within a range of 0.9 eV to 1.25 eV. The inventors have further found that equations indicated by two straight lines shown in FIG. 2B are obtained, and even though the concentration of oxygen atoms in oxygen-containing molybdenum is identical, the Schottky barrier height ($\phi B$) fluctuates between the two straight lines. The values are just an example of values obtained through experiments, and other values may be employed. The relationship between the concentration of oxygen atoms and the Schottky barrier height is not limited to molybdenum, and is estimated to be present in other metals that can be employed as the material of the Schottky electrode 34.

As described above, in a case where the Schottky electrode 34 is made of oxygen-containing molybdenum, the concentration of oxygen atoms in oxygen-containing molybdenum is adjusted, whereby it is possible to adjust the Schottky barrier height between the Schottky electrode 34 and the semiconductor substrate 12. As a result, for example, it is possible to sufficiently reduce a leak current value. In addition, in the semiconductor apparatus 10, a pn junction surface is formed between the p-type contact layers 38 and the drift layer 42. As a result, when a reverse bias voltage is applied, the drift layer 42 sandwiched between the p-type contact layers 38 is completely depleted, whereby the leak current value is significantly reduced.

Figure 3:
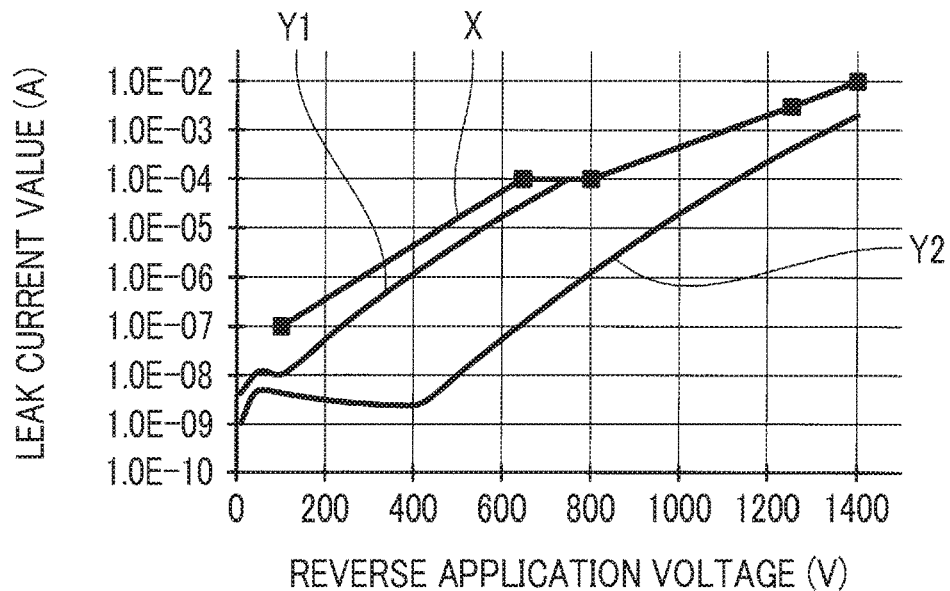
FIG. 3 is a graph showing the relationship between a reverse application voltage and a leak current value.

FIG. 3 distinctively shows characteristics relating to the leak current value of the semiconductor apparatus 10 according to the embodiment of the present disclosure for each concentration of oxygen atoms of oxygen-containing molybdenum forming the Schottky electrode 34. In FIG. 3, a graph line Y1 indicates a case where the concentration of oxygen atoms of oxygen-containing molybdenum forming the Schottky electrode 34 is 1.2E19 $cm^{-3}$. The Schottky barrier height ($\phi B$) at this time is 0.93 eV. A graph line Y2 indicates a case where the concentration of oxygen atoms of oxygen-containing molybdenum forming the Schottky electrode 34 is 3.0E19 $cm^{-3}$. The Schottky barrier height ($\phi B$) at this time is 1.22 eV. As an example, a graph line X indicates a standard value required for the semiconductor apparatus 10. As shown in FIG. 3, it is confirmed that, when the concentration of oxygen atoms in the oxygen-containing molybdenum becomes higher, the Schottky barrier height ($\phi B$) becomes higher, and the leak current value is reduced.

A manufacturing method of the semiconductor apparatus 10 according to the embodiment of the present disclosure will be described. An internal structure of the semiconductor substrate 12, the insulating film 20, and the protective film 22 can be manufactured by various existing methods. Accordingly, here, detailed description of the manufacturing method will be omitted. Hereinafter, solely the internal structure of the semiconductor substrate 12 and a step of forming the Schottky electrode 34 in a semi-manufactured product 150 of the semiconductor apparatus 10, in which the insulating film 20 is formed, will be described.

Figure 4:
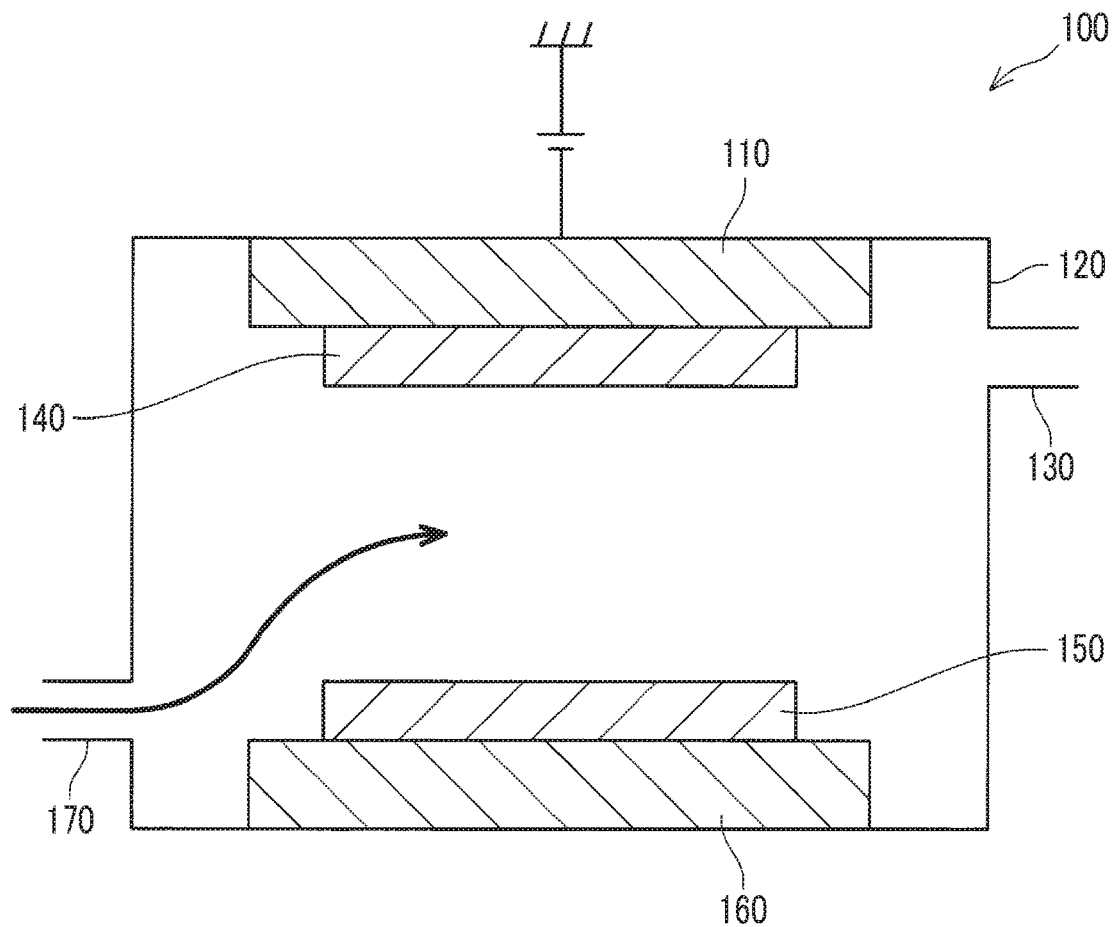
FIG. 4 shows an apparatus for a sputtering method.

In the embodiment of the present disclosure, the Schottky electrode 34 is formed by reactive sputtering. FIG. 4 shows a sputtering apparatus 100 for forming the Schottky electrode 34. The sputtering apparatus 100 includes a holder 110, a vacuum chamber 120, and a stage 160. The holder 110 and the stage 160 are disposed inside the vacuum chamber 120. The holder 110 is configured to hold the target 140, and is connected to an external power supply. The stage 160 is configured to support the semi-manufactured product 150 of the semiconductor apparatus 10, and is electrically grounded. The vacuum chamber 120 has a gas outlet 130 and a gas inlet 170.

In forming the Schottky electrode 34, first, the target 140 and the semi-manufactured product 150 are disposed inside the vacuum chamber 120. The target 140 is made of molybdenum that becomes a principal component of the Schottky electrode 34. Next, after the vacuum chamber 120 is sufficiently reduced in pressure, atmospheric gas is introduced from the gas inlet 170 into the vacuum chamber 120. As atmospheric gas, inert gas having argon gas as a principal component is used. A small amount of oxygen gas is added to atmospheric gas. Another gas containing oxygen atoms, such as carbon dioxide gas or water vapor, may be added to atmospheric gas, instead of or in addition to oxygen gas.

Figure 5A:
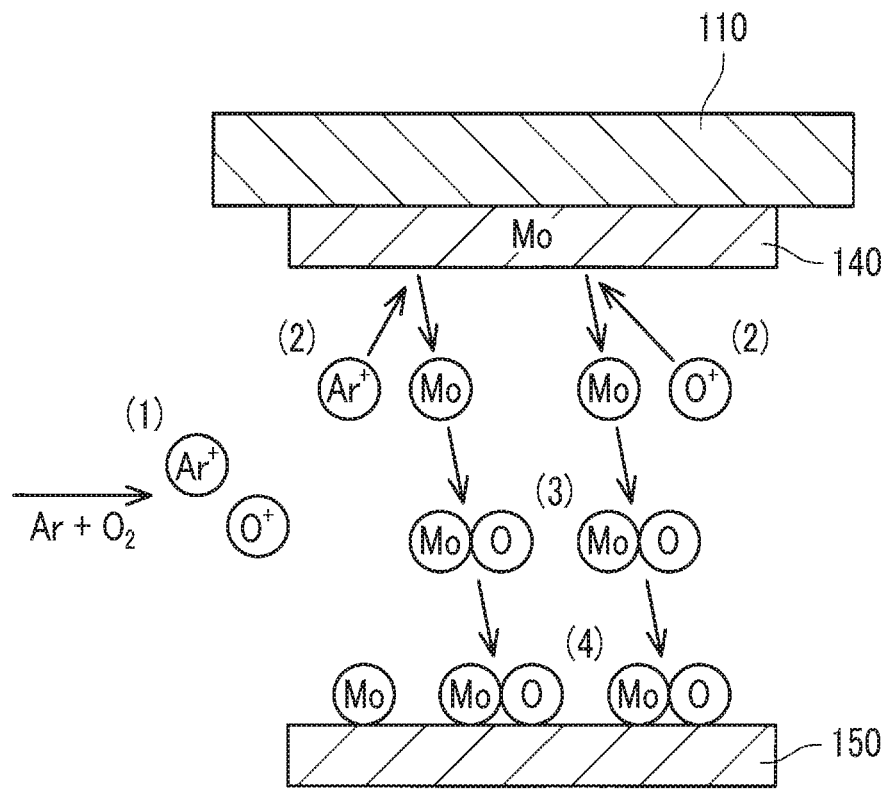
FIG. 5A is an explanatory view showing a step of forming a Schottky electrode of a first example.

A first example will be described referring to FIGS. 5A and 5B. As shown in FIG. 5A, introduced atmospheric gas is ionized by discharge inside the vacuum chamber 120. That is, as indicated by (1) in the drawing, introduced oxygen gas and argon gas are ionized. Next, as indicated by (2) in the drawing, argon ions and oxygen ions collide with the target 140. Accordingly, molybdenum atoms or a union of molybdenum atoms and oxygen atoms is released from the target 140. Next, as indicated by (3) in the drawing, a part of released molybdenum atoms collides with and is bonded to oxygen ions. However, a large amount of molybdenum atoms move toward the semi-manufactured product 150 without reaction. As indicated by (4) in the drawing, molybdenum atoms or a union of molybdenum atoms and oxygen atoms is deposited on the surface of the semi-manufactured product 150. Accordingly, the Schottky electrode 34 made of oxygen-containing molybdenum is formed.

Figure 5B:
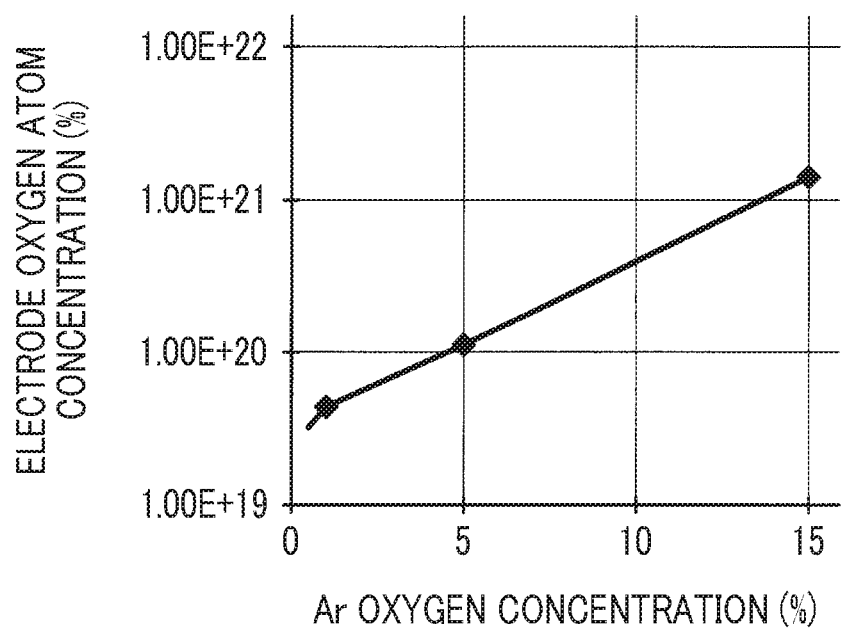
FIG. 5B is a graph showing the relationship between a concentration of oxygen atoms contained in a metal material and an oxygen concentration in atmospheric gas.

FIG. 5B is a graph showing the relationship between the concentration of oxygen gas that is added to atmospheric gas (here, argon gas) and the concentration of oxygen atoms in the Schottky electrode 34 (that is, oxygen-containing molybdenum) formed in the above-described manner. As shown in FIG. 5B, it is confirmed that the concentration of oxygen atoms of the Schottky electrode 34 becomes high when the concentration of oxygen atoms in atmospheric gas becomes high. It is confirmed that, in a case where the concentration of oxygen atoms in atmospheric gas is adjusted to be less than 15%, the concentration of oxygen atoms in oxygen-containing molybdenum becomes less than $1.0E22$ $cm^{-3}$. In this case, production of an oxide is suppressed, whereby oxygen-containing molybdenum can maintain sufficient conductivity.

In the first example, the Schottky electrode 34 is made of molybdenum containing a predetermined concentration of oxygen atoms. As a result, it is possible to make the Schottky barrier height between the Schottky electrode 34 and the semiconductor substrate 12 higher compared to a case where molybdenum does not contain oxygen atoms. Oxygen-containing molybdenum forming the Schottky electrode 34 contains oxygen atoms. However, since the metal material has a comparatively low concentration of oxygen atoms and is different from molybdenum oxide, the conductivity of the Schottky electrode 34 is sufficiently maintained. As a result, the Schottky electrode 34 can be formed even with a single layer structure. Accordingly, it is possible to restrain a manufacturing process of the Schottky electrode from becoming complicated. Therefore, it is possible to more easily form the Schottky electrode 34 having a higher Schottky barrier height with respect to the semiconductor substrate 12.

In the first example, the forming of the Schottky electrode 34 is performed by a reactive sputtering method using atmospheric gas containing oxygen atoms. With the configuration described above, the concentration of oxygen atoms in atmospheric gas is changed, whereby it is possible to adjust the concentration of oxygen atoms contained in the Schottky electrode 34 (in the first example, oxygen-containing molybdenum).

A second example will be described referring to FIGS. 6A and 6B. In the second example, the step of forming the Schottky electrode 34 is different from the first example. For this reason, hereinafter, solely the step of forming the Schottky electrode 34 will be described, and other descriptions will be omitted. Even in the second example, the Schottky electrode 34 is formed using the sputtering apparatus 100 of FIG. 4.

Figure 6A:
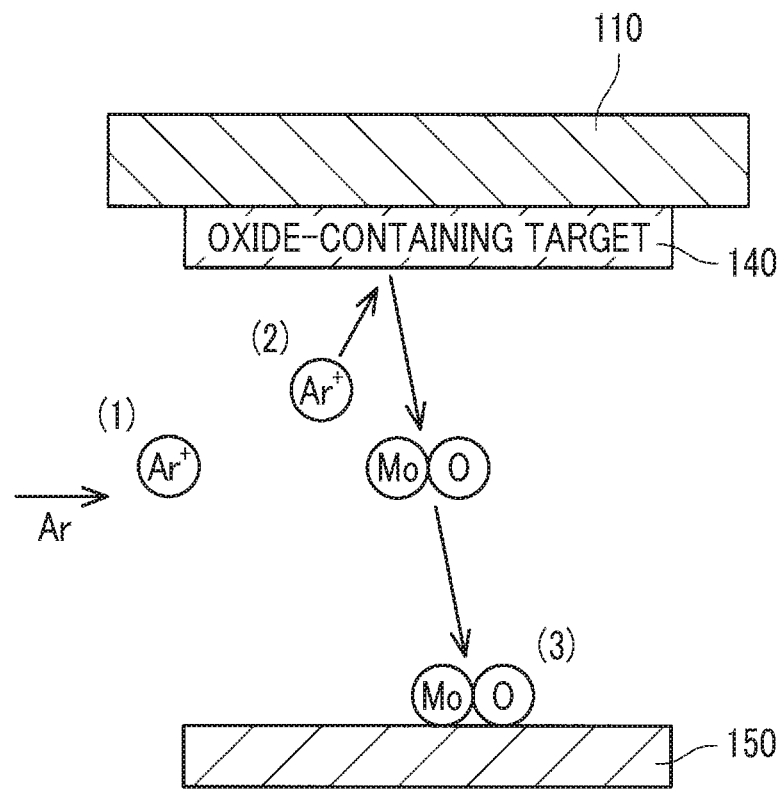
FIG. 6A is an explanatory view showing a step of forming a Schottky electrode of a second example.

As shown in FIG. 6A, in the second example, an oxide of molybdenum to be a principal component of the Schottky electrode 34 is contained in the target 140. However, the target 140 can be a sintered compact of a mixture of molybdenum powder and molybdenum trioxide ($MoO_3$) powder. As atmospheric gas, inert gas, such as argon gas, can be used. If needed, gas containing oxygen atoms may be added to atmospheric gas.

According to the above-described method, first, as indicated by (1) in the drawing, introduced argon gas (or other inert gas) is ionized. Next, as indicated by (2) in the drawing, argon ions collide with the target 140. Accordingly, molybdenum atoms and oxygen atoms are released from the target 140. As indicated by (3) in the drawing, the released molybdenum atoms and oxygen atoms are deposited on the surface of the semi-manufactured product 150. Accordingly, the Schottky electrode 34 made of oxygen-containing molybdenum is formed.

Figure 6B:
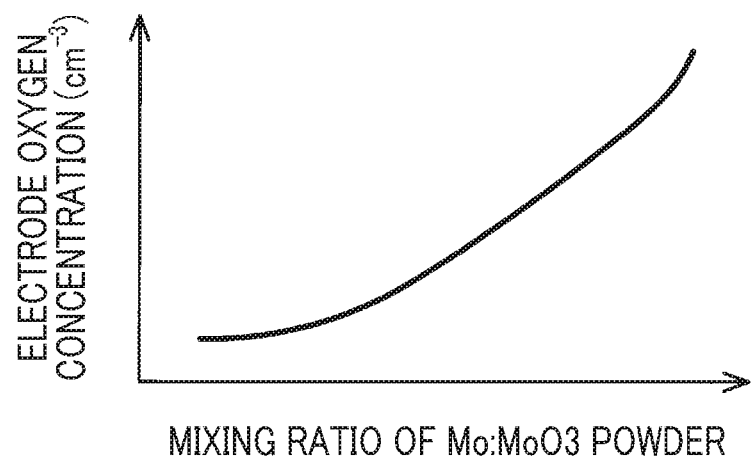
FIG. 6B is a graph showing the relationship between a concentration of oxygen atoms contained in a metal material and a mixture ratio of a metal material and a metal oxide in a target.

FIG. 6B is a graph showing the relationship between a mixture ratio of molybdenum powder and molybdenum trioxide ($MoO_3$) powder in the target 140 and the concentration of oxygen atoms of the Schottky electrode 34 (that is, in oxygen-containing molybdenum) formed in the above-described manner. As shown in FIG. 5B, the mixture ratio of the molybdenum trioxide in the target 140 is made high, whereby it is possible to make the concentration of oxygen atoms in the Schottky electrode 34 higher.

Even in the second example, it is possible to more easily form the Schottky electrode 34 having a higher Schottky barrier height with respect to the semiconductor substrate 12. In the second example, the mixture ratio of molybdenum powder and molybdenum trioxide ($MoO_3$) powder in the mixture forming the target 140 is changed, whereby it is possible to adjust the concentration of oxygen atoms contained in the Schottky electrode 34 (in the second example, oxygen-containing molybdenum).

Subsequently, a third example will be described referring to FIGS. 7, 8A, and 8B. In the third example, the step of forming the Schottky electrode 34 is different from the first example. For this reason, hereinafter, solely the step of forming the Schottky electrode 34 will be described, and other descriptions will be omitted. Even in the third example, the Schottky electrode 34 can be formed using the sputtering apparatus 100 shown in FIG. 4.

Figure 7:
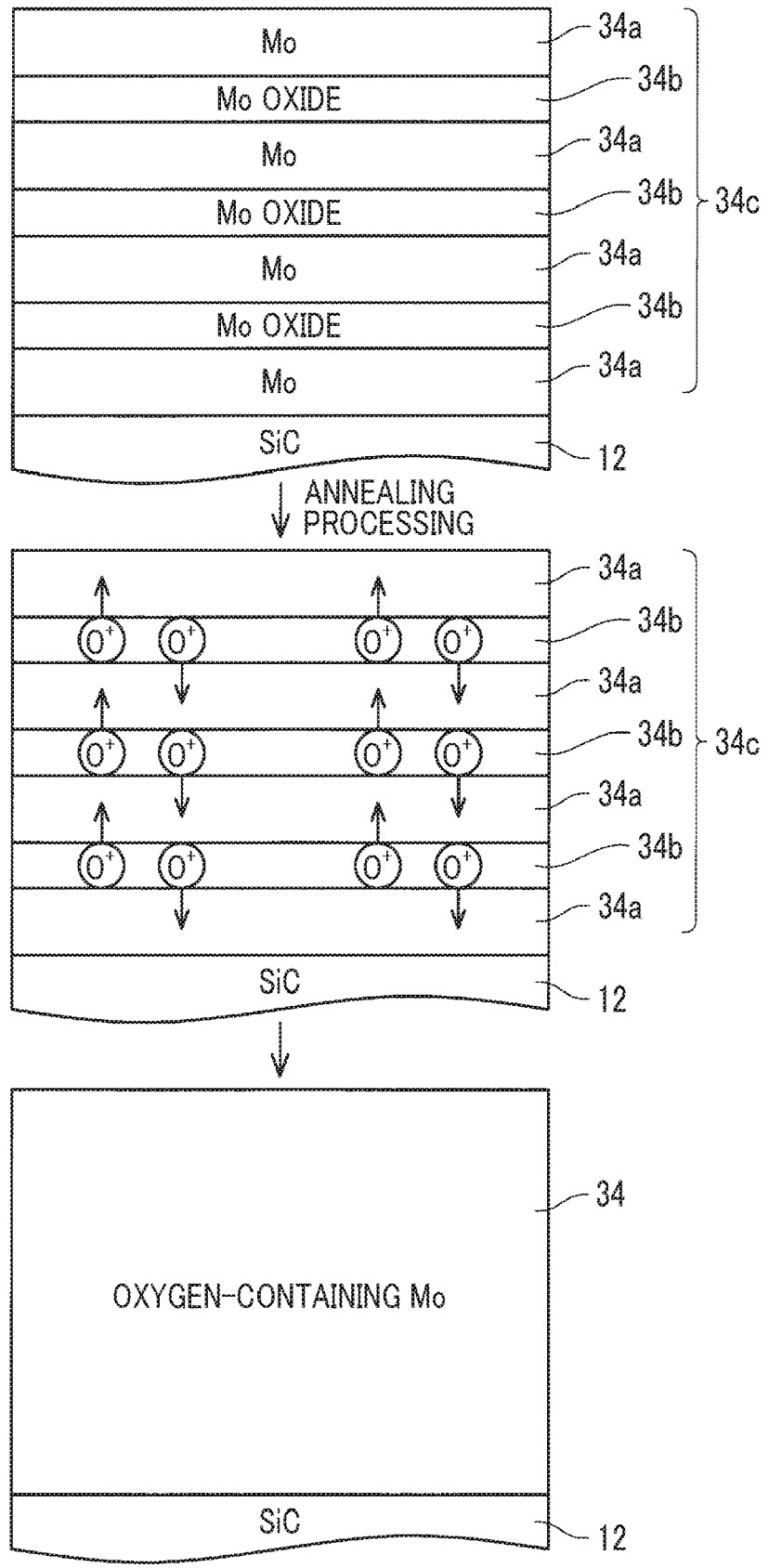
FIG. 7 is an explanatory view showing a step of forming a Schottky electrode of a third example.

As shown in FIG. 7, in the third example, first, a molybdenum layer 34a made of molybdenum and a molybdenum oxide layer 34b made of a molybdenum oxide are alternately laminated on the upper surface of the semiconductor substrate 12. Thereafter, a laminated structure 34c to be the Schottky electrode 34 is formed. In the example shown in FIG. 7, four molybdenum layers 34a and three molybdenum oxide layers 34b are formed. However, the number of laminated molybdenum layers 34a and molybdenum oxide layers 34b is not particularly limited. In the laminated structure 34c, at least one molybdenum layer 34a and at least one molybdenum oxide layer 34b may be included. The molybdenum oxide forming the molybdenum oxide layer 34b may be a form represented by any formula of MoO, $MoO_2$, $MoO_3$, and $Mo_2O_3$.

In forming the molybdenum layer 34a and the molybdenum oxide layer 34b, the sputtering apparatus 100 shown in FIG. 4 can be used. In this case, the target 140 or atmospheric gas are varied, whereby it is possible to selectively form the molybdenum layer 34a and the molybdenum oxide layer 34b. Alternatively, the forming of the molybdenum oxide layer 34b is not limited to reactive sputtering. For example, a layer of molybdenum may be formed by sputtering, and then, the layer of molybdenum may be oxidized, thereby forming a molybdenum oxide layer. A method of oxidizing the layer of molybdenum is not particularly limited. For example, heat treatment or the like under atmosphere exposure or under an atmosphere containing oxygen is exemplified.

The laminated structure 34c of the molybdenum layers 34a and the molybdenum oxide layers 34b is formed. Subsequently, annealing processing of the laminated structure 34c is performed. With this, the oxygen atoms contained in the molybdenum oxide layer 34b are diffused to the adjacent molybdenum layer 34a. As a result, the laminated structure 34c of the molybdenum layers 34a and the molybdenum oxide layers 34b is changed to an integrated metal layer made of oxygen-containing molybdenum. With this, the Schottky electrode 34 made of oxygen-containing molybdenum is formed.

Figure 8A:
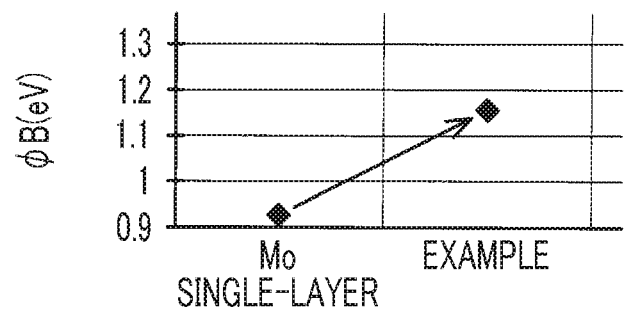
FIG. 8A is a graph related to a Schottky barrier height of the third example.

FIG. 8A is a graph showing a Schottky barrier height in a case where the Schottky electrode 34 is made of solely molybdenum in comparison with a Schottky barrier height in a case where the Schottky electrode 34 is formed by the manufacturing method of the third example. As shown in FIG. 8A, with the Schottky electrode 34 formed by the manufacturing method of the third example, it is confirmed that the Schottky barrier height increases by 0.2 eV compared to a case where the Schottky electrode 34 is made of solely molybdenum.

Figure 8B:
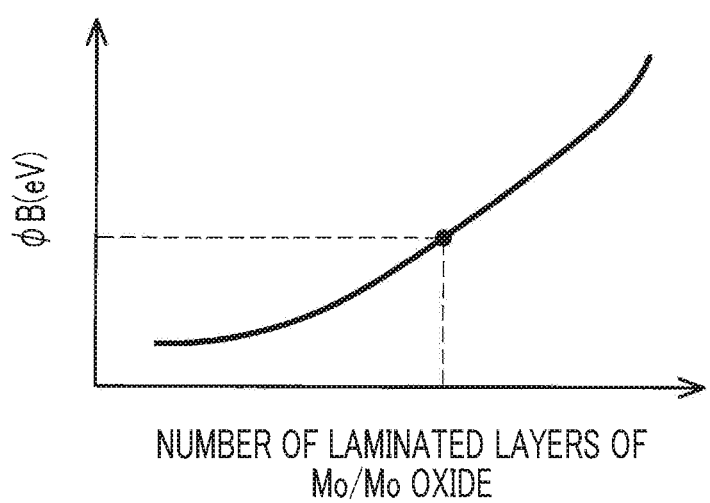
FIG. 8B is a graph related to the Schottky barrier height of the third example.

FIG. 8B is a graph showing the relationship between the number of laminated layers of the laminated structure 34c to be formed and the Schottky barrier height ($\phi$B) of the Schottky electrode 34. As shown in FIG. 8B, the number of laminated layers of the laminated structure 34c is increased, whereby it is possible to increase the Schottky barrier height of the Schottky electrode 34. In addition, the thickness of the molybdenum oxide layer 34b is changed, whereby it is possible to adjust the Schottky barrier height of the Schottky electrode 34.

Even in the third example, it is possible to more easily form the Schottky electrode 34 having the Schottky barrier height between the Schottky electrode 34 and the semiconductor substrate 12. In the third example, the number or thickness of molybdenum oxide layers is changed, whereby it is possible to adjust the concentration of oxygen atoms contained in the Schottky electrode 34 (in the third example, oxygen-containing molybdenum).

Subsequently, a fourth example will be described referring to FIGS. 9 and 10. In the fourth example, the step of forming the Schottky electrode 34 is different from the first example. First, the step of forming the Schottky electrode 34 of the fourth example will be described referring to FIG. 9. For ease of understanding, in FIG. 9, the insulating film 20 and the layers 38, 39, 40 formed in the semiconductor substrate 12 are not shown.

Figure 9:
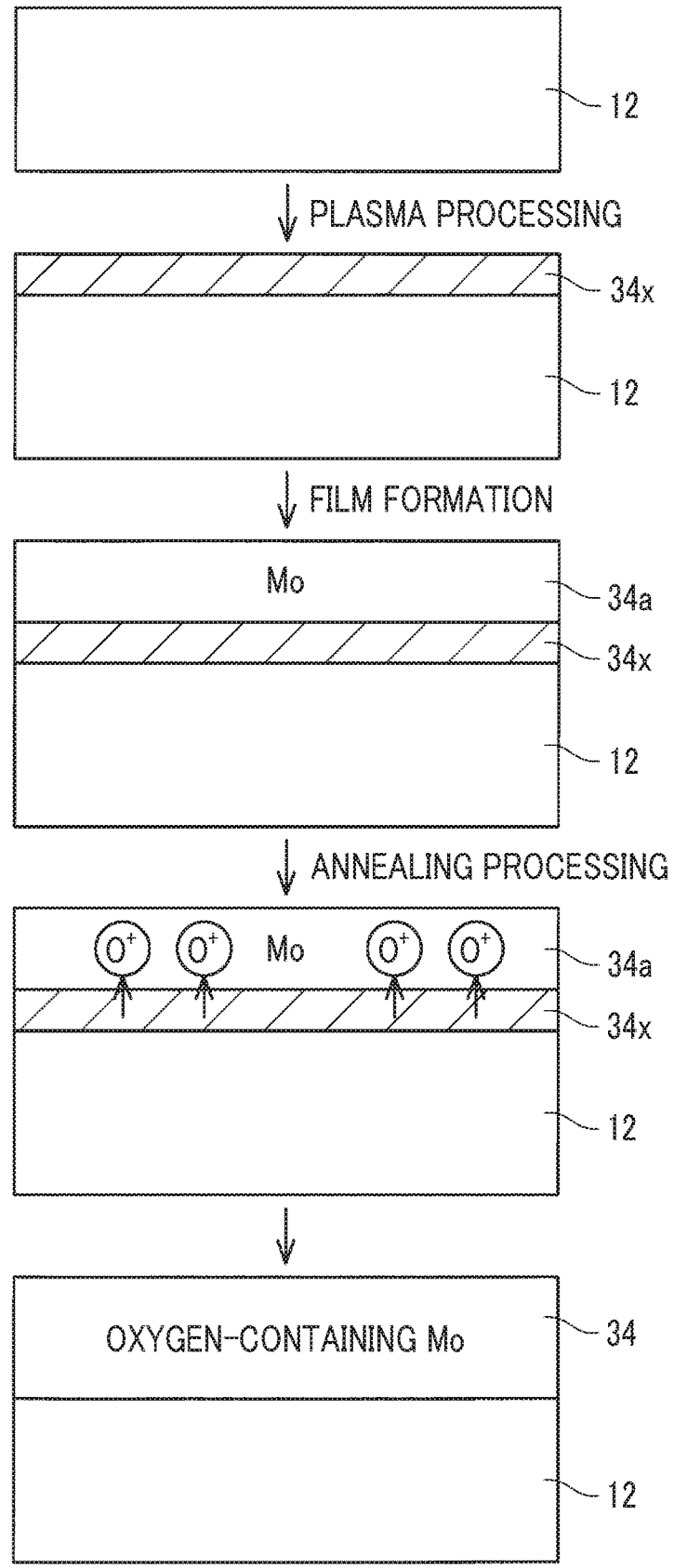
FIG. 9 is an explanatory view showing a step of forming a Schottky electrode of a fourth example.

In FIG. 9, first, the surface of the semiconductor substrate 12 is oxidized by plasma processing using oxygen gas to form an oxide layer 34x on the semiconductor substrate 12. Next, a molybdenum layer 34a made of molybdenum is formed on the formed oxide layer 34x by sputtering or the like described above. Then, the semiconductor substrate 12 in which the molybdenum layer 34a is formed is subjected to annealing processing to diffuse oxygen atoms from the oxide layer 34x to the molybdenum layer 34a and to form the Schottky electrode 34 made of oxygen-containing molybdenum.

Figure 10:
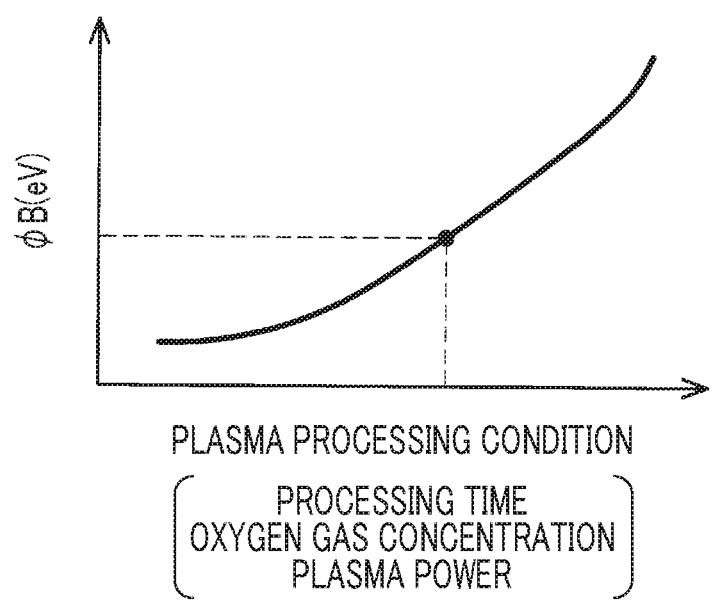
FIG. 10 is a graph showing the relationship between a plasma processing condition and a Schottky barrier height.

FIG. 10 is a graph showing the relationship between a plasma processing condition and the Schottky barrier height of the Schottky electrode 34. The plasma processing condition includes any one of a processing time of plasma processing, a concentration of oxygen gas for use in the plasma processing, and plasma power in the plasma processing. As shown in FIG. 10, the processing time is extended, the concentration of oxygen gas is made high, or plasma power is made large, whereby the surface of the semiconductor substrate 12 is further oxidized. As a result, it is possible to further increase the Schottky barrier height of the Schottky electrode 34.

Even in the fourth example, it is possible to more easily form the Schottky electrode 34 having a higher Schottky barrier height with respect to the semiconductor substrate 12. In the fourth example, the degree of oxidizing the surface of the semiconductor substrate 12 is changed, whereby it is possible to perform adjustment to the predetermined concentration of oxygen atoms contained in the Schottky electrode 34 (that is, oxygen-containing molybdenum).

Although specific examples of the present disclosure have been described above in detail, these are merely for illustration and are not intended to limit the claims. Technical features described in the specification or the drawings may technically be useful alone or in various combinations, and are not limited to the combinations as originally claimed. The technique illustrated in the specification or the drawings may concurrently achieve a plurality of objects, and technical significance thereof resides in achieving one of the objects.

What is claimed is:

1. A method of manufacturing a semiconductor apparatus, the method comprising:
    preparing a semiconductor substrate; and
    forming a Schottky electrode that is in Schottky contact with a surface of the semiconductor substrate,
    wherein the Schottky electrode is made of a metal material containing a predetermined concentration of oxygen atoms, and wherein:
    the Schottky electrode has a single layer structure of the metal material,
    the semiconductor substrate is a silicon carbide substrate;
    the metal material is molybdenum; and
    the predetermined concentration is a value within a range of $1.0E19$ $cm^{-3}$ to $1.0E22$ $cm^{-3}$.

2. The method according to claim 1, wherein the forming of the Schottky electrode is performed by a reactive sputtering method that adds gas containing oxygen atoms to atmospheric gas.

3. The method according to claim 1, wherein the forming of the Schottky electrode is performed by a sputtering method using a target containing an oxide of the metal material.

4. The method according to claim 1, wherein:
in forming the Schottky electrode,
a laminated structure having a layer of the metal material and a layer of an oxide of the metal material alternately laminated is formed on the surface of the semiconductor substrate; and
the semiconductor substrate on which the laminated structure is formed is subjected to annealing processing to diffuse oxygen atoms from the layer of the oxide of the metal material to the layer of the metal material.

5. The method according to claim 1, wherein:
in forming the Schottky electrode,
the surface of the semiconductor substrate is oxidized;
a film of the metal material is formed on the oxidized surface of the semiconductor substrate; and
the semiconductor substrate on which the film is formed is subjected to annealing processing to diffuse oxygen atoms from the semiconductor substrate to the film.

6. A semiconductor apparatus comprising:
a semiconductor substrate; and
a Schottky electrode that is in Schottky contact with an upper surface of the semiconductor substrate,
wherein the Schottky electrode is made of a metal material containing a predetermined concentration of oxygen atoms, and wherein:
the Schottky electrode has a single layer structure of the metal material,
the semiconductor substrate is a silicon carbide substrate;
the metal material is molybdenum; and
the predetermined concentration is a value within a range of $1.0E19$ $cm^{-3}$ to $1.0E22$ $cm^{-3}$.

\* \* \* \* \*